(12) United States Patent
Long et al.

(10) Patent No.: US 7,045,011 B2
(45) Date of Patent: May 16, 2006

(54) DUAL-LAYER COMPLIANT POLYMERIC NOZZLE

(75) Inventors: David C. Long, Wappingers Falls, NY (US); Jason S. Miller, Poughkeepsie, NY (US); Randall J. Werner, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 10/604,257

(22) Filed: Jul. 7, 2003

(65) Prior Publication Data

US 2005/0005843 A1    Jan. 13, 2005

(51) Int. Cl.
*B05B 15/04* (2006.01)

(52) U.S. Cl. .................. 118/301; 118/406; 118/410; 101/120; 101/123; 101/124; 101/125

(58) Field of Classification Search .............. 101/120, 101/123, 124, 125, 366; 118/301, 406, 410; 347/45, 47

See application file for complete search history.

(56) References Cited

U.S. PATENT DOCUMENTS

| | | | | |
|---|---|---|---|---|
| 3,987,724 A | * | 10/1976 | Zimmer | ............ 101/119 |
| 4,612,874 A | * | 9/1986 | Mitter | ............ 118/410 |
| 5,578,151 A | | 11/1996 | Andris et al. | |
| 5,925,414 A | | 7/1999 | Buechele et al. | |
| 5,955,119 A | | 9/1999 | Andris et al. | |
| 6,045,615 A | | 4/2000 | Buechele et al. | |
| 6,062,135 A | | 5/2000 | Buechele et al. | |
| 6,132,510 A | | 10/2000 | Buechele et al. | |
| 6,629,754 B1 | * | 10/2003 | Fukushima et al. | ............ 347/45 |

* cited by examiner

*Primary Examiner*—Laura Edwards
(74) *Attorney, Agent, or Firm*—Gibb I.P. Law Firm, LLC; James Cioffi, Esq.

(57) ABSTRACT

An integrated circuit screen printing nozzle that has a nozzle body, a first inner layer on the nozzle body, a second outer layer on the first layer, and an opening through the nozzle body, the first layer, and the second layer. The first and second layers can be an insert held within the body. The opening allows paste material to flow through the screen printing nozzle to the stencil mask. Also, the second outer layer includes a contact surface adapted to contact the stencil mask. One feature of the invention is that the first layer is softer (has a lower durometer) than the second layer. This allows the second layer to be more durable than the first layer and for the first layer to provide additional flexibility to the second layer. Therefore, the invention provides a nozzle that has the high durability characteristics of a hard outer surface with the compliance of a soft nozzle.

14 Claims, 3 Drawing Sheets

DUAL-LAYER COMPLIANT POLYMERIC NOZZLE

BACKGROUND OF INVENTION

1. Field of the Invention

The present invention generally relates to screen printing and more particularly to an improved paste nozzle that includes two layers, where the inner layer is softer than the outer layer.

2. Description of the Related Art

Thick-film metal-mask screening requires an extrusion-type nozzle for applying paste to stencil masks to produce personalized conductive thick-film features including conductive lines and filling thru vias. One example is U.S. Pat. No. 6,132,510 (incorporated herein by reference) in which a single-layer compliant nozzle is disclosed. Conventional nozzle design primarily enables the formation of thick, high definition features, and secondarily preserves the stencil mask integrity. For high line definition, a rigid contact surface is preferable. To the contrary, for long mask life, high nozzle contact surface compliance is needed. The compliance achievable with single-layer compliant nozzle is limited by the requirement that the nozzle not scoop paste out of the stencil during screening or get abraded by the mask surface. Conventional nozzles focus primarily on line definition, resulting in poor mask wear characteristics. The present disclosure seeks to satisfy both goals, enabling high quality stencil screening with very low stencil wear characteristics.

SUMMARY OF INVENTION

A dual-layer compliant polymeric screening nozzle (Dual Durometer Nozzle (DDN)) is disclosed. Thus, the following describes a multi-layer ceramic (MLC) screen printing nozzle that has a nozzle body, a first inner layer on the nozzle body, a second outer layer on the first layer, and an opening through the nozzle body, the first layer, and the second layer. The first and second layers can be an insert held within the body. The opening allows paste material to flow through the screen printing nozzle to the stencil mask. Also, the second outer layer includes a contact surface adapted to contact the stencil mask. One feature of the invention is that the first layer is softer (has a lower durometer) than the second layer. This allows the second layer to be more durable (abrasion resistant) and rigid than the first layer and produce less scoop out and for the first layer to provide additional flexibility to the second layer. Therefore, the invention provides a nozzle that has the high durability (durability implies wear characteristics) characteristics of a hard outer surface with the compliance of a soft nozzle. The inventive nozzle's stiffer outer layer helps with screening quality as well.

BRIEF DESCRIPTION OF DRAWINGS

The invention will be better understood from the following detailed description of preferred embodiments with reference to the drawings, in which.

DETAILED DESCRIPTION

As mentioned above, the compliance achievable with single-layer compliant nozzle is limited by the requirement that the nozzle not scoop paste out of the stencil during screening or get abraded by the mask surface. Therefore, a dual-layer compliant polymeric screening nozzle (Dual Durometer Nozzle (DDN)) is disclosed. The inventive dual-layer nozzle is superior to the conventional nozzles because it enables much greater overall compliance while still maintaining the high-durometer external surface contact required for high definition stencil printing processes.

Figure 1:
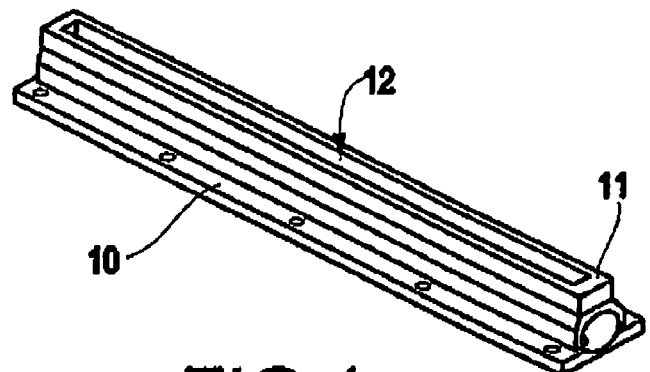
FIG. 1 is a perspective view schematic diagram of a single-layer compliant nozzle.
Figure 2:
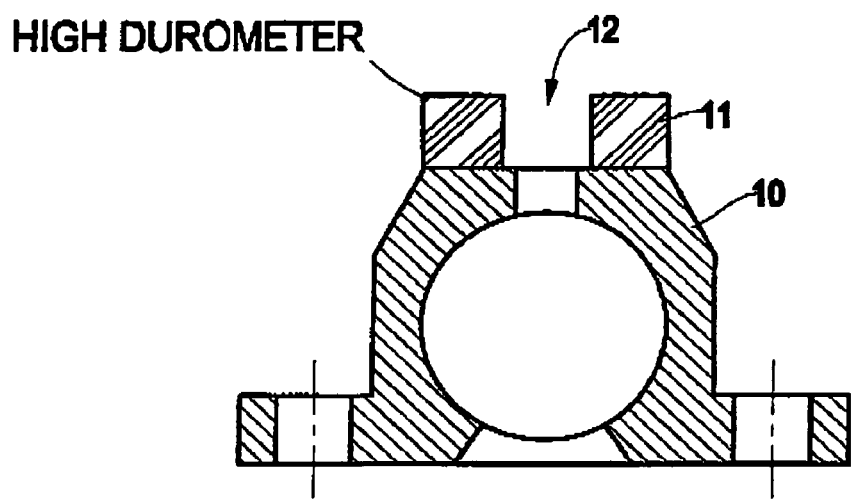
FIG. 2 is a cross-sectional view schematic diagram of the single-layer compliant nozzle shown in FIG. 1.

FIG. 1 is a perspective drawing of a standard compliant screening nozzle. The nozzle includes a body 10 and a single-layer contact portion 11 that contacts the stencil mask. In conventional nozzles, the body 10 is substantially harder (higher durometer usually metal/steel) than the contact surface 11. An opening 12 allows paste material to flow through the screen printing nozzle to the stencil mask. FIG. 2 shows this same nozzle in cross section.

As mentioned above, conventional nozzle design primarily enables the formation of thick, high definition features, and secondarily preserves the stencil mask integrity. For high line definition, a more rigid contact surface 11 is preferable. To the contrary, for long mask life, high nozzle contact surface 11 compliance is needed. The compliance achievable with such a single-layer compliant nozzle contact surface 11 is limited by the requirement that the nozzle not scoop paste out of the stencil during screening or get abraded by the mask surface. Conventional nozzles focus primarily on line definition, resulting in poor mask wear characteristics.

Figure 3:
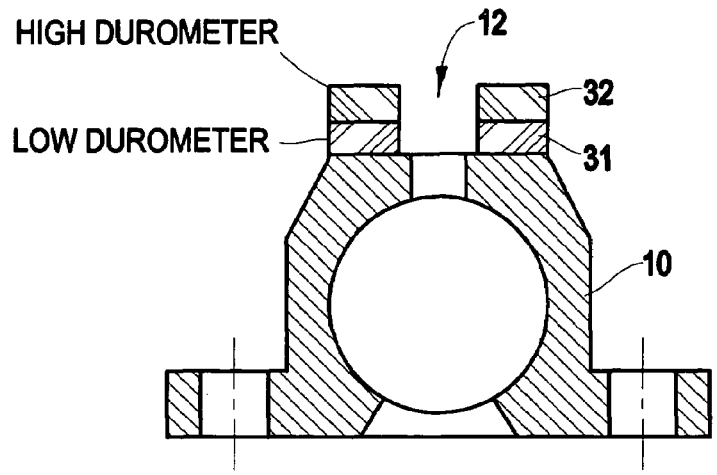
FIG. 3 is a cross-sectional view schematic diagram of a dual-layer compliant nozzle.

FIG. 3 shows the inventive DDN nozzle in cross section. The structure includes a hard metal/steel nozzle body 10, a first rubber (polyurethane, polymeric material, graphite filled plastics, and other engineered plastics) inner contact layer 31 bonded to the nozzle body, and a second rubber (polyurethane, polymeric material, graphite filled plastics, and other engineered plastics) outer contact layer 32 bonded to the first layer. The first and second layers can also be inserts held within the body (instead of being bonded) and can have a flat or angled outer surface (as discussed in U.S. Pat. No. 6,132,510). The second outer contact layer 32 is the layer that actually makes contact with the stencil mask.

One feature of the invention is that the first layer 31 is softer (has a lower durometer) than the second layer 32. For example, the first layer 31 can have a durometer between 25 and 70, while the second layer 32 can have a durometer between 70 and 90 (e.g., polyurethane less than or equal to 100 shore A hardness and engineered plastics less than or equal to 100 shore D hardness). The forgoing durometer ranges are only exemplary and the invention is not limited to these ranges. Preferably, the outer layer 32 is approximately 1.5–4.0 times harder than the softer inner layer 31 (the outer layer 32 preferably has a durometer 1.5 times to 4.0 times the durometer of the softer inner layer 31). In addition, the thickness of the outer layer 32 controls how hard the outer layer 32 can be made. For example, if the outer layer 32 is made thinner than the inner layer 31, the additional compliance provided by the softer inner layer 31 will be more easily transmitted through the surface of the harder layer 32 than if the outer layer 32 is substantially thicker. Therefore, the invention preferably increases the durometer of the outer layer 32 while decreasing the thickness of the outer layer 32 so that the nozzle will produce high definition, yet still be compliant enough to provide excellent wear characteristics. The body 10 is substantially rigid, and much harder than the first or second layers.

The lower durometer inner layer 31 increases compliance, protecting the mask from denting caused by particles of debris located between the mask and the workpiece, or scoring caused by high local forces from nozzle misalignment or non-planarity of the workpiece and/or underlying workpiece holding chuck. The high durometer outer layer 32, which is in contact with stencil, prevents feature scoop-out and enables high-quality lines of sufficient line height for high-performance packaging. This allows the second layer 32 to be more durable than the first layer 31 and for the first layer 31 to provide additional flexibility to the second layer 32.

The inner "low durometer" layer 31 of the DDN nozzle provides improved compliance over the standard high durometer compliant nozzle, while the high durometer outer layer 32 maintains the same high definition screening performance of the standard high durometer compliant nozzle. Therefore, the invention provides a nozzle that has the high durability characteristics of a hard outer surface with the compliance of a soft nozzle.

Figure 4:
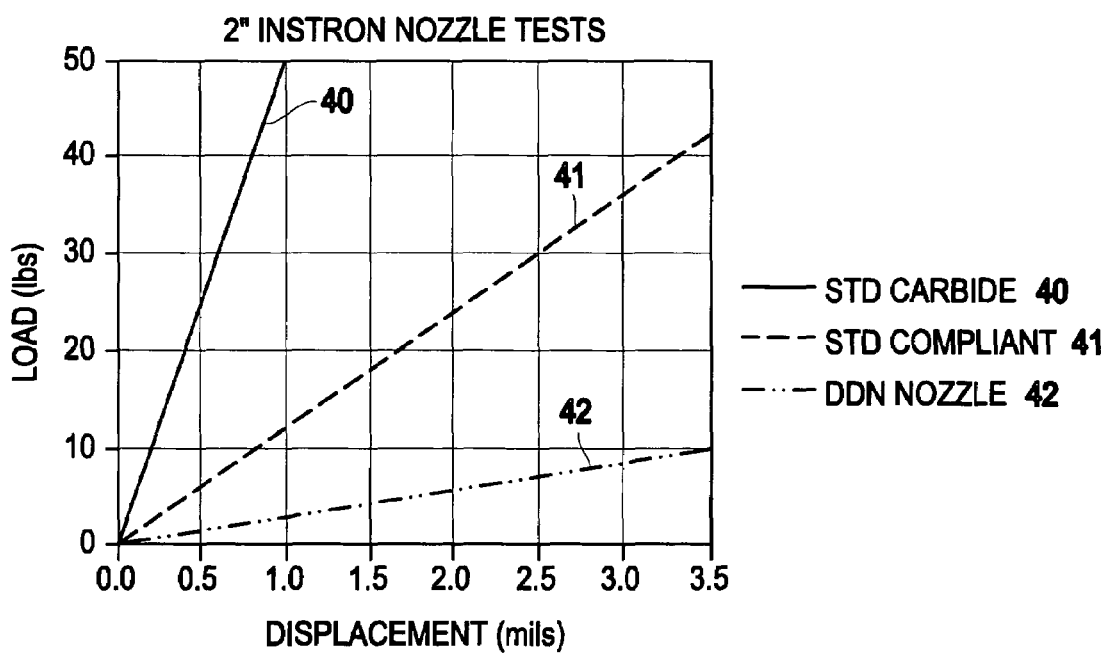
FIG. 4 is a graph illustrating the performance achieved with the invention.

The increase in compliance of the DDN nozzle shown in FIG. 3 over the standard single-layer contact nozzle is illustrated in FIG. 4. To obtain the data shown in this graph, the inventive dual-layer nozzle 42 was compared to a standard (very high durometer) noncompliant carbide nozzle 40 and to a (high durometer) single-layer compliant nozzle 41. Each nozzle was placed between two 2" pieces of steel and compressed using an Instron testing machine. As shown by line 42 in FIG. 4, the inventive structure is substantially more compliant than the other structures and will still provide good line definition.

Figure 5:
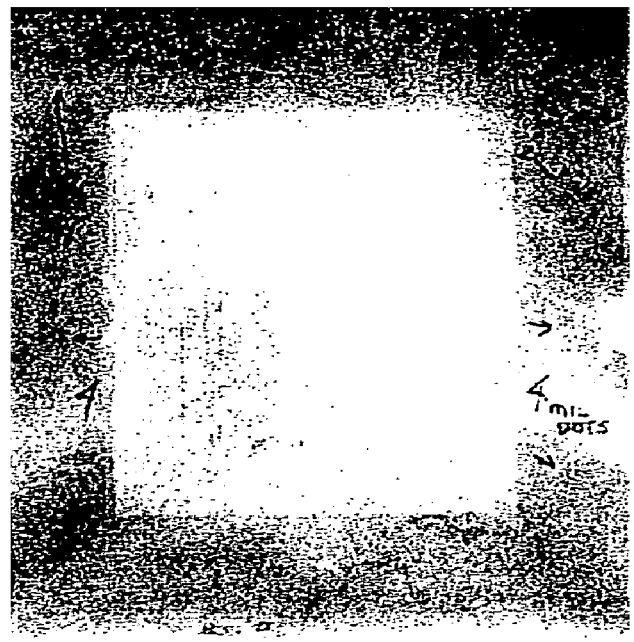
FIG. 5 is a schematic illustration of wear produced by the nozzle shown in FIG. 3.
Figure 6:
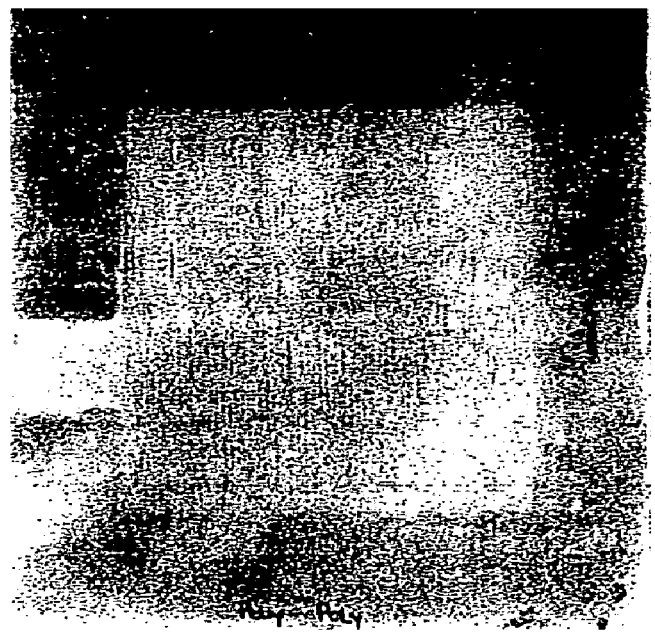
FIG. 6 is a schematic illustration of wear produced by the nozzle shown in FIGS. 1 and 2.

FIG. 5 illustrates the mask wearing characteristics of the inventive DDN nozzle, while FIG. 6 illustrates the mask wearing characteristics of the single-layer nozzle. Each schematic illustrates wear on a stencil mask. To simulate common screening debris, "dots" approximately 0.2 in diameter and approximately 0.004 (4 mils) thick were placed between the greensheet (workpiece) and the mask during screening. In FIG. 6, the outline of the dot can be observed to have burnished its image in the mask when screened with a standard Poly Nozzle. These same dots were placed under a second mask and screened using a DDN nozzle. The result of this experiment is shown in FIG. 5. As can be observed in FIG. 5, a much reduced or blemish is observable on the mask in the location of the dot. The DDN nozzle has conformed to the distortion caused by the dots and has protected the mask from harm by limiting increase in the local pressure over the dots.

As a softer compliant nozzle wears it can generate small particles of material which can result in reduced conductivity of the screened conductors. Having a more durable nozzle helps prevent this from occurring. The DDN can more easily conform to slight variations of the greensheet resulting in better sealing (gasketing) of the mask to the greensheet while the nozzle is transferring the paste thru the mask. Thereby yielding improved line definition, less bleed-out, and improved overall sheet quality.

Therefore, as shown above, the invention provides a compliant two-layer nozzle contact, where the first layer is softer (has a lower durometer) than the second layer. This allows the second layer to be more durable and stiffer than the first layer and reduce scoop out and for the first layer to provide additional flexibility to the second layer. Therefore, the invention provides a nozzle that has the high durability characteristics of a hard outer surface with the compliance of a soft nozzle.

While the invention has been described in terms of preferred embodiments, those skilled in the art will recognize that the invention can be practiced with modification within the spirit and scope of the appended claims.

What is claimed is:

1. A screen printing nozzle comprising:
   a nozzle body;
   a first rubber layer on said nozzle body;
   a second rubber layer on said first rubber layer, wherein said second rubber layer includes a contact surface adapted to contact a stencil mask, and wherein said second rubber layer has a durometer that is approximately 1.5 to 4.0 times a durometer of said first rubber layer; and
   an opening through said nozzle body, said first rubber layer, and said second rubber layer, wherein said opening is adapted to allow material to flow through said screen printing nozzle to said stencil mask.

2. The screen printing nozzle in claim 1, wherein said first rubber layer is softer than said second rubber layer.

3. The screen printing nozzle in claim 1, wherein said second rubber layer is more abrasion resistant than said first rubber layer.

4. The screen printing nozzle in claim 1, wherein said first rubber layer provides additional flexibility to said second rubber layer.

5. The screen printing nozzle in claim 1, wherein said first rubber layer and said second rubber layer comprise an insert held within said body.

6. The screen printing nozzle in claim 1, wherein said first rubber layer is bonded to said body and said second rubber layer is bonded to said first rubber layer.

7. The screen printing nozzle in claim 1, wherein said first rubber layer and said second comprise one of: polyurethane, polymeric material, graphite filled plastics, and other engineered plastics.

8. A screen printing nozzle comprising:
   a nozzle body;
   a first rubber layer on said nozzle body;
   a second rubber layer on said first rubber layer, wherein said second rubber layer includes a contact surface adapted to contact a stencil mask, wherein said second rubber layer has a durometer that is approximately 1.5 to 4.0 times a durometer of said first rubber layer, wherein said second rubber layer comprises a thickness equal to or greater than said first rubber layer, and wherein said durometer of said second rubber layer is dependent upon said thickness of said second layer; and
   an opening through said nozzle body, said first rubber layer, and said second rubber layer, wherein said opening is adapted to allow material to flow through said screen printing nozzle to said stencil mask.

9. The screen printing nozzle in claim 8, wherein said first rubber layer has a lower durometer than said second rubber layer.

10. The screen printing nozzle in claim 8, wherein said second rubber layer is more durable than said first rubber layer.

11. The screen printing nozzle in claim 8, wherein said first rubber layer provides additional flexibility to said second rubber layer.

12. The screen printing nozzle in claim 8, wherein said first rubber layer and said second rubber layer comprise an insert held within said body.

13. The screen printing nozzle in claim 8, wherein said first rubber layer is bonded to said body and said second rubber layer is bonded to said first rubber layer.

14. The screen printing nozzle in claim 8, wherein said first rubber layer and said second rubber layer comprise one of: polyurethane, polymeric material, graphite filled plastics, and other engineered plastics.

* * * * *